United States Patent [19]

Shah et al.

[11] Patent Number: 4,579,600
[45] Date of Patent: Apr. 1, 1986

[54] METHOD OF MAKING ZERO TEMPERATURE COEFFICIENT OF RESISTANCE RESISTORS

[75] Inventors: Rajiv Shah, Plano; Samuel L. Hughey, Garland, both of Tex.

[73] Assignee: Texas Instruments Incorporated, Dallas, Tex.

[21] Appl. No.: 505,523

[22] Filed: Jun. 17, 1983

[51] Int. Cl.$^4$ .......................................... H01L 21/425
[52] U.S. Cl. ................................ 148/1.5; 29/576 B; 29/577 C
[58] Field of Search ............ 148/1.5; 29/576 B, 577 C

[56] References Cited

U.S. PATENT DOCUMENTS

| | | | |
|---|---|---|---|
| 3,902,926 | 9/1975 | Perloff et al. | 148/1.5 |
| 4,007,297 | 2/1977 | Robinson et al. | 148/DIG. 60 |
| 4,047,976 | 9/1977 | Bledsoe et al. | 148/1.5 |
| 4,144,100 | 3/1979 | MacIver | 148/1.5 |
| 4,231,809 | 11/1980 | Schmidt | 148/1.5 |
| 4,266,986 | 5/1981 | Benton et al. | 148/1.5 |
| 4,318,752 | 3/1982 | Tien | 148/1.5 |
| 4,319,954 | 3/1982 | White et al. | 148/1.5 X |
| 4,364,779 | 12/1982 | Kamgur et al. | 148/1.5 |
| 4,464,839 | 8/1984 | Dath et al. | 148/1.5 |
| 4,467,519 | 8/1984 | Glang et al. | 29/576 B |

Primary Examiner—George T. Ozaki
Attorney, Agent, or Firm—Robert Groover; Jim Comfort; Melvin Sharp

[57] ABSTRACT

Polysilicon resistors and integrated circuits are brought to zero or positive temperature coefficient (TCR) by a combination of laser annealing and ionic hydrogen plasma treatment.

15 Claims, 9 Drawing Figures

METHOD OF MAKING ZERO TEMPERATURE COEFFICIENT OF RESISTANCE RESISTORS

BACKGROUND AND SUMMARY OF THE INVENTION

The present invention relates to integrated circuits incorporating resistors.

A problem in the prior art of resistors for use in integrated circuits has been the temperature dependence of the resistance. Polysilicon resistors normally have a very large negative temperature coefficient of resistance (TCR), whereas diffused resistors in monocrystalline silicon typically have a very large positive TCR. For many device applications, it is highly desirable to have resistors with small or zero TCR.

Thus, it is an object of the present invention to provide a method for fabricating integrated circuits having resistors with zero or small variation in resistance with temperature change. Resistors having near-zero TCR are desirable for various applications, such as analog circuits, data conversion circuits and specialty instrumentation circuits, and static random access memories (SRAMs).

However, a problem which affects a larger range of devices is the thermal instability which can result from resistors having a negative TCR. That is, a resistor having a negative TCR, if temporarily overheated, will pass more current, and thus will be likely to receive even more ohmic heating. In some circuits, this can cause thermal runaway which destroys the resistor and/or other parts of the circuit. This is a particular problem in the art of bipolar devices. For this reason, bipolar devices have typically used diffused resistors because of their positive TCR. However, the use of diffused resistors makes device layout much more difficult and results in a more complex processing.

Thus, it is an object of the present invention to provide a method for fabricating polysilicon resistors whose resistance increases with increasing temperature.

It is a further object of the present invention to provide bipolar integrated circuits incorporating polysilicon resistors whose resistance increases with temperature.

The problems of thermal instability and resistors are particularly important in bipolar integrated circuits commonly due to the relatively high current densities commonly used, but are not by any means limited to that art.

Thus, it is an object of the present invention to provide integrated circuits incorporating polysilicon resistors whose resistance increases with temperature.

Another problem with integrated circuit resistors according to the prior art is their radiation hardness. That is, conventional resistors will change their TCR significantly when irradiated, because radiation-generated carriers are trapped at defect sites or ground boundaries in the resistor.

Thus, it is an object of the present invention to provide integrated circuits incorporating resistors whose TCR does not change substantially with radiation.

According to the present invention there is provided:

A method for fabricating polysilicon resistors in integrated circuits, comprising the steps of:
depositing polysilicon;
transiently annealing said deposited polysilicon to increase the grain size thereof;
passivating said transiently annealed polysilicon with a passivating species, to reduce the trap density at the grain boundaries of said polysilicon; and
forming connections to said polysilicon to form resistors.

BRIEF DESCRIPTION OF THE DRAWINGS

The present invention will be discussed with reference to the accompanying drawings wherein:

FIG. 3b is a circuit diagram of the device of FIG. 3a;

DESCRIPTION OF THE PREFERRED EMBODIMENTS

Figure 1:
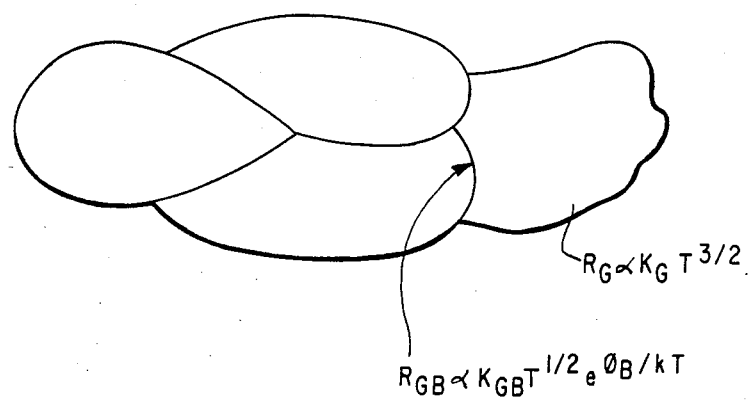
FIG. 1 schematically shows the grain structure of polysilicon.

There are two contributions to the resistivity of the polysilicon, namely the resistance $R_g$ of the grains and the resistance $R_{gb}$ of the grain boundaries, as is shown schematically in FIG. 1. The total resistance is thus given by $R_p = R_g + R_{gb}$. The temperature dependence of the grain resistance is known to be $$R_G \sim K_G T^{3/2} \qquad (1)$$

The temperature dependence of the grain boundary resistance is also known and can be written as $$R_{GB} \sim K_{GB} T^{\frac{1}{2}} e^{\phi_B / KT} \qquad (2)$$

These two temperature dependences means that the temperature dependence of the total resistance $R_p$ varies as $$R_p \sim K_G T^{3/2} + A K_{GB} T^{\frac{1}{2}} e^{\phi_B / KT} \qquad (3)$$

, and therefore the change in total resistance with temperature can be written explicitly in general as (4)

$$\frac{dR_p}{dT} = [aT^{1/2} + bT^{-1/2} e^{Q_B/kT}] - \qquad (4)$$

$$cQ_B T^{-3/2} e^{Q_B/kT}$$

where $\phi_B$ is the grain boundary barrier height. This is known to be proportional to the ratio of the trap density $Q_t$ at the grain boundary to the bulk doping density N, i.e.

$$\phi_B \sim \left( \frac{Q_t^2}{N} \right) \qquad (5)$$

In the general expression of equation 4, it can be seen that polysilicon has a negative TCR because polysilicon has a large third term in the right hand side of equation 4. That is, the large trap density $Q_t$ implies a large value for $\phi_B$, and this large value of $\phi_B$ produces a very large third term on the right side of equation 4. Note that a high bulk doping density N will produce a lower $\phi_B$, but, for the doping levels of most interest for polysilicon resistors (e.g. $10^{17}-10^{18}$ per cubic centimeter) $\phi_B$ is still significant. However, for any value of the doping density N, the TCR of a polysilicon resistor can be decreased by decreasing the third term of equation 4.

Laser annealing changes the TCR in at least two ways. First, laser annealing increases the grain size. This decreases the number of grain boundaries, and therefore the contribution of $R_{gb}$ to the total resistance $R_p$ is reduced. This also means that the contribution of $dR_{gb}dt$ to $dR_p/dt$ is reduced, and therefore the TCR becomes closer to zero. Secondly, laser annealing also tends to reduce the trap density $Q_t$ at each grain boundary and thus lowers $\phi_B$ and again decreases the negative component of the TCR.

Figure 2:
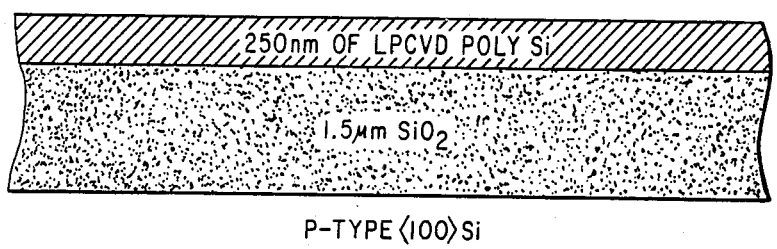
FIG. 2 shows a section through a simple polysilicon resistor structure fabricated according to the present invention.

The present invention teaches use of *both* laser processing and hydrogen annealing to reduce the negative component of TCR in polysilicon resistors. A polysilicon resistor structure such as shown in FIG. 2 in the as-deposited state will typically have a grain size of 500 Angstroms.

Laser annealing is then applied at a modest energy density, e.g. 0.6 joules per square centimeter, to increase the grain size. In the presently preferred embodiment a 1.06 micron line from a neodymium:YAG laser is used, using 150 nanosecond duration pulses at a pulse frequency of 10 kilohertz and a scan speed of six inches per second. This implies a power density in the neighborhood of 4 megawatts per square centimeter.

In another sample embodiment of the invention a seven watt argon laser is operated clockwise, and a 100 micron spot from this laser is scanned at a velocity of 8-10 inches per second with a stepping interval of ten microns.

Other embodiments of laser annealing can be used, and are well known to those skilled in the art.

Subsequent to the laser annealing step, an ionic hydrogen anneal is applied. It should be noted that this is an atomic hydrogen anneal and not a molecular hydrogen anneal, that is, the hydrogen is preferably exposed to a plasma discharge which causes dissociation. The hydrogen ions diffuse readily into the polysilicon and bind to dangling bonds at the grain boundaries. This lowers the trap density $Q_t$ at the grain boundaries, and therefore reduces the negative contribution to the TCR.

However, hydrogen annealing alone is normally not sufficient to provide a zero or positive TCR in small-grain polysilicon. In the preferred embodiment of the present invention *both* laser annealing and ionic hydrogen passivation are used. This two step process has been shown to provide polysilicon resistors having a positive TCR.

Figure 4:
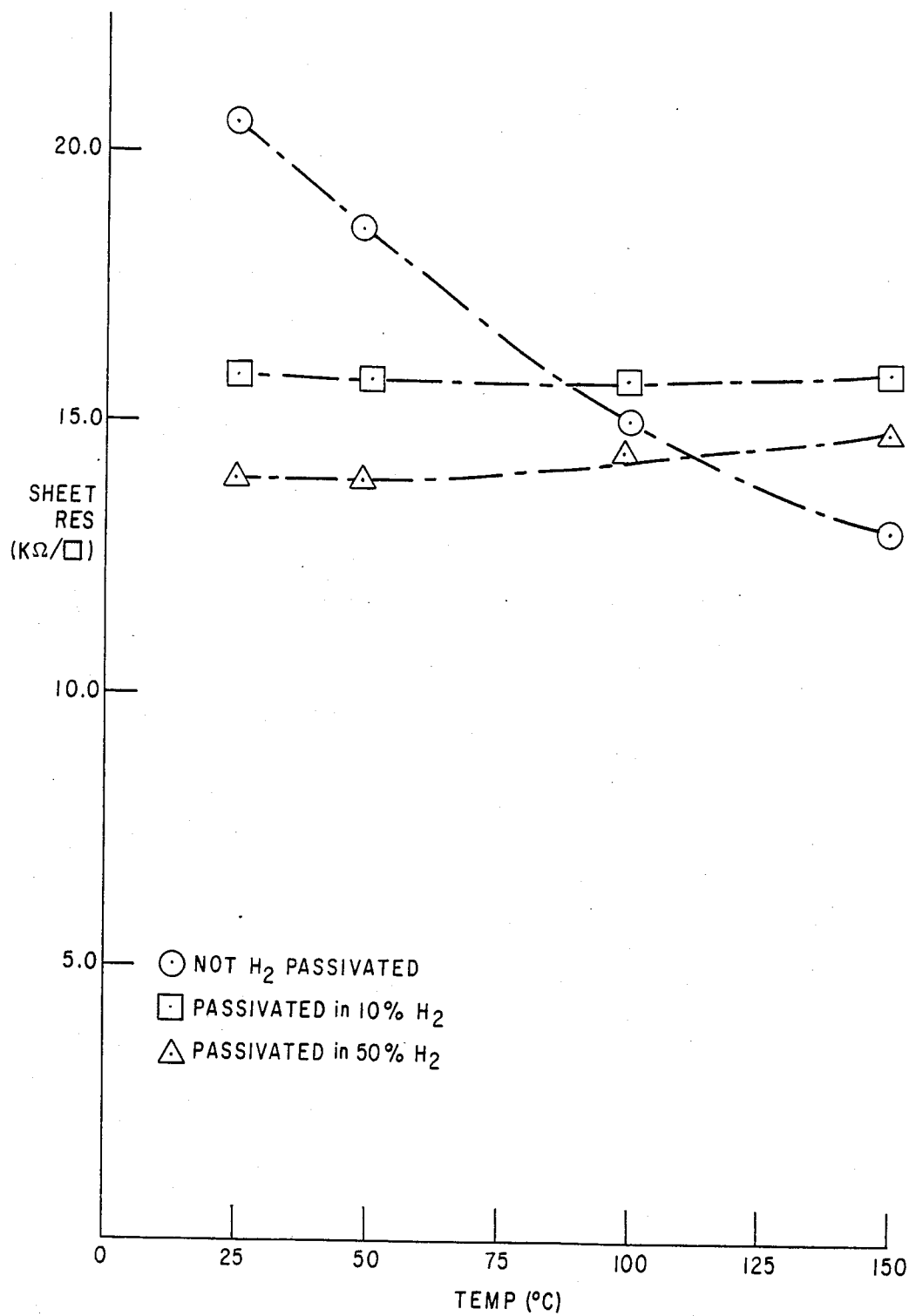
FIGS. 4–7 show curves of resistance versus temperature for polysilicon resistors fabricated according to the present invention, and also for some polysilicon resistors fabricated by prior art methods.
Figure 5:
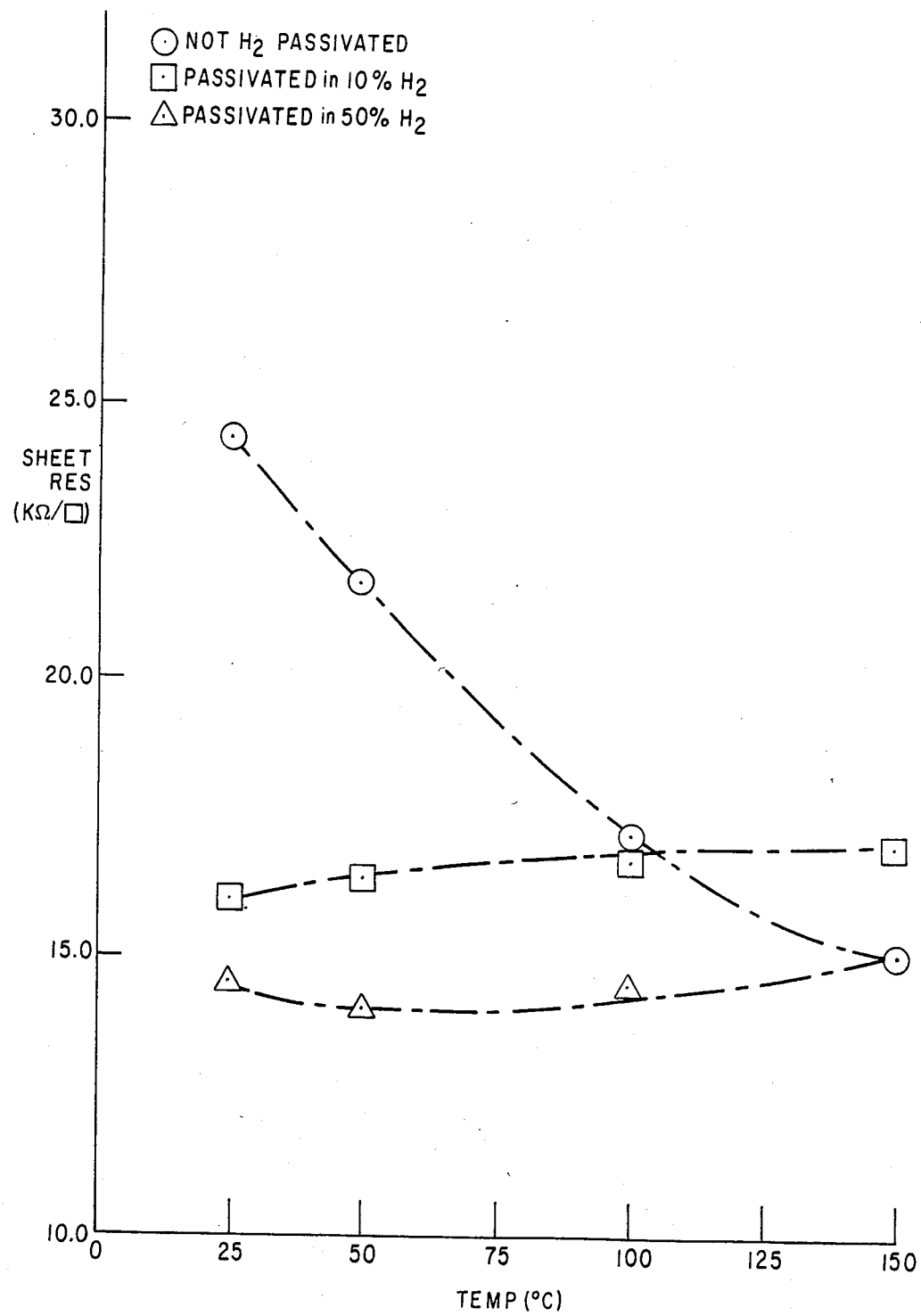
Figure 6:
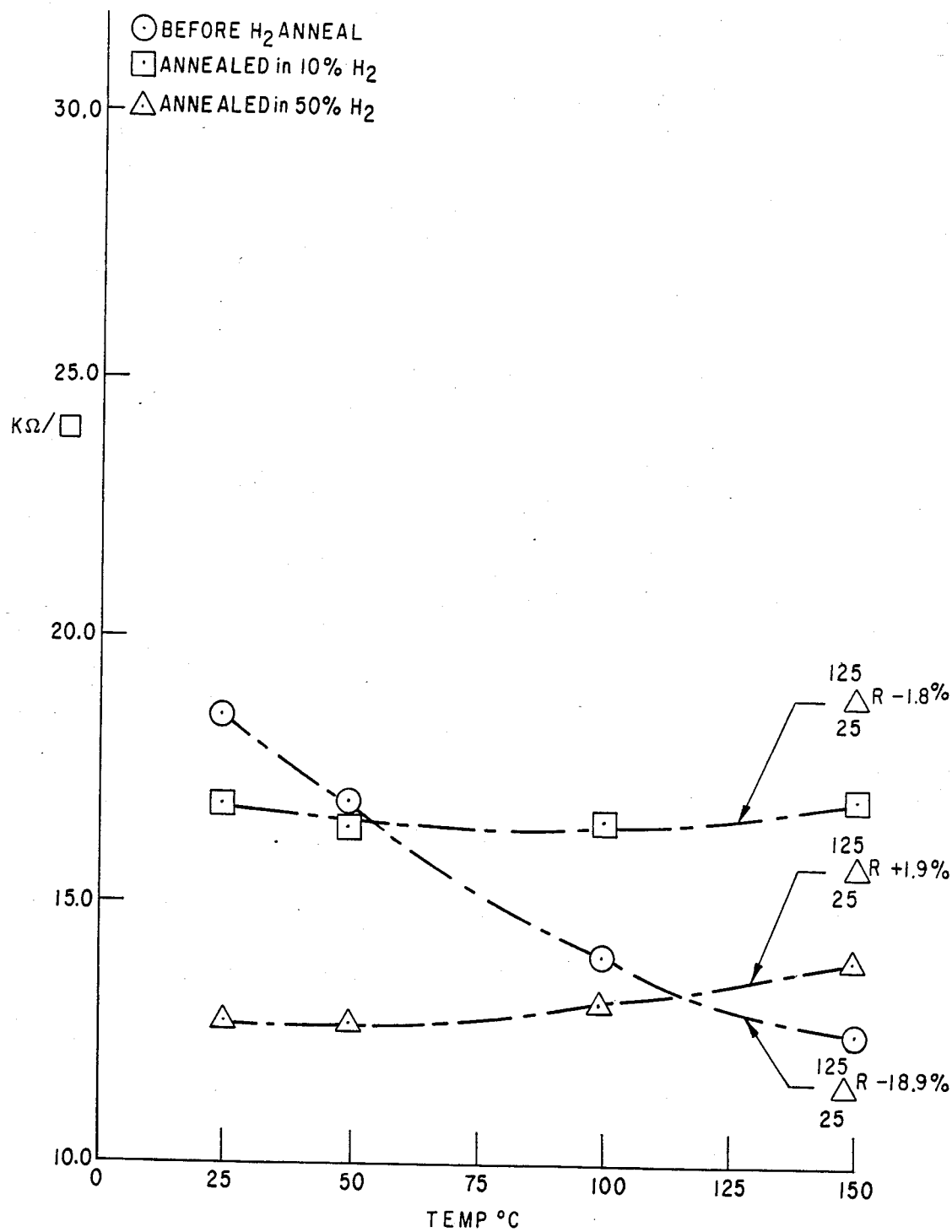
Figure 7:
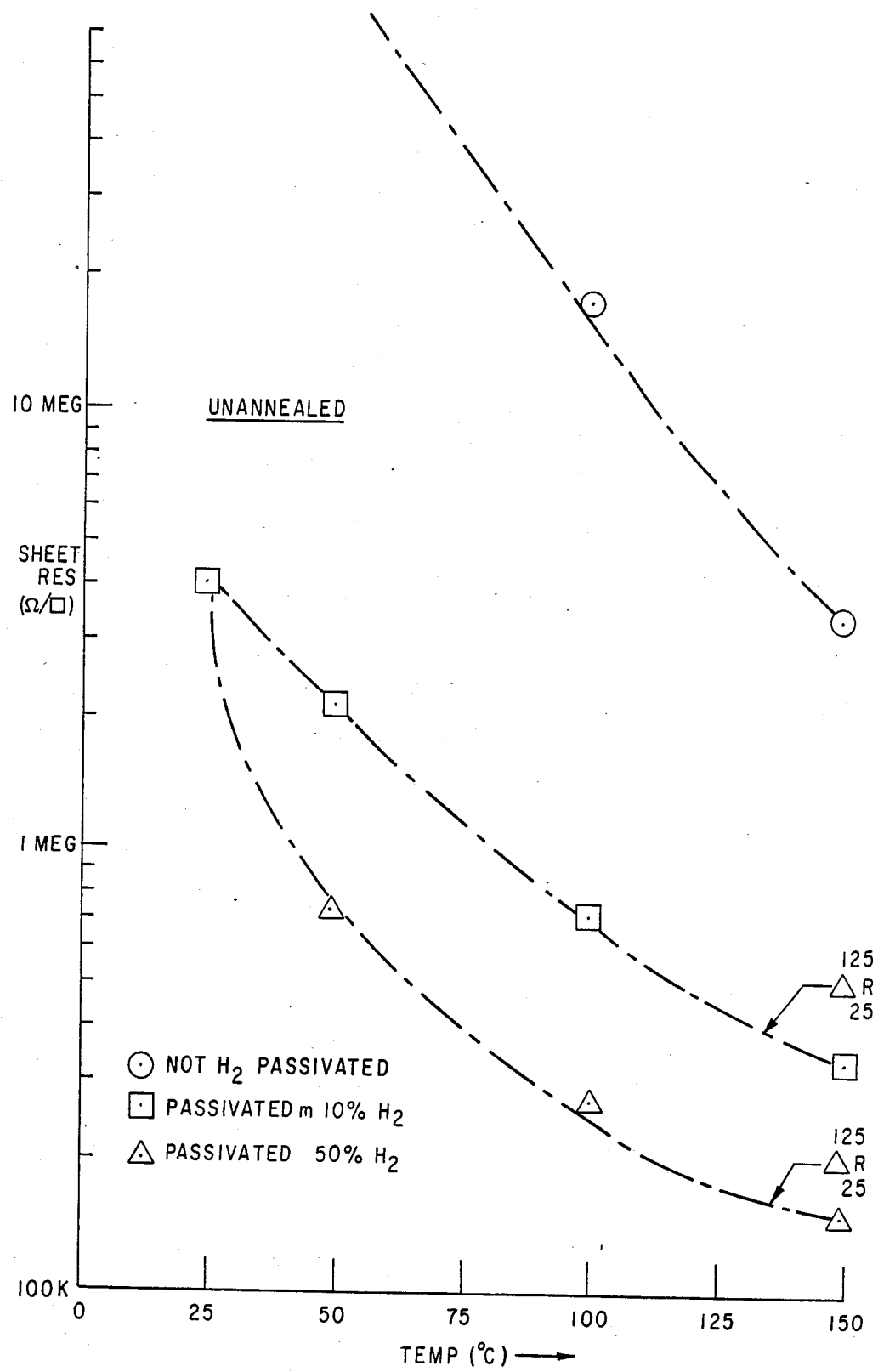

The conditions of hydrogen plasma passivation are not critical. However, in the present invention, passivation is performed at 300° C. and a mixture of 50% hydrogen and 50% nitrogen at a pressure of one Torr. These gases are flowed at about 2000 standard cubic centimeters, and a power of about 600 watts is applied over an electrode area of about 350-400 square inches, with an electrode separation of about 2.5 inches. The polysilicon thickness used in FIGS. 4, 5 and 6 is in the range of 400-500 nanometers, and the grain size of the polysilicon is in the range of 3-5 microns in annealed material.

In a second embodiment of the invention, the hydrogen anneal is performed under the same conditions, except that the gas mixture contains only 10% of hydrogen rather than 50%. Results measured for actual devices using these conditions are also shown separately plotted in FIGS. 4, 5, and 6. For precision and data conversion applications, the 10% hydrogen annealing conditions result in resistors having approximately zero TCR, as seen in FIGS. 4 and 6. For these applications, it is desirable not to continue the hydrogen anneal too long, or the TCR will become positive.

Figure 8:
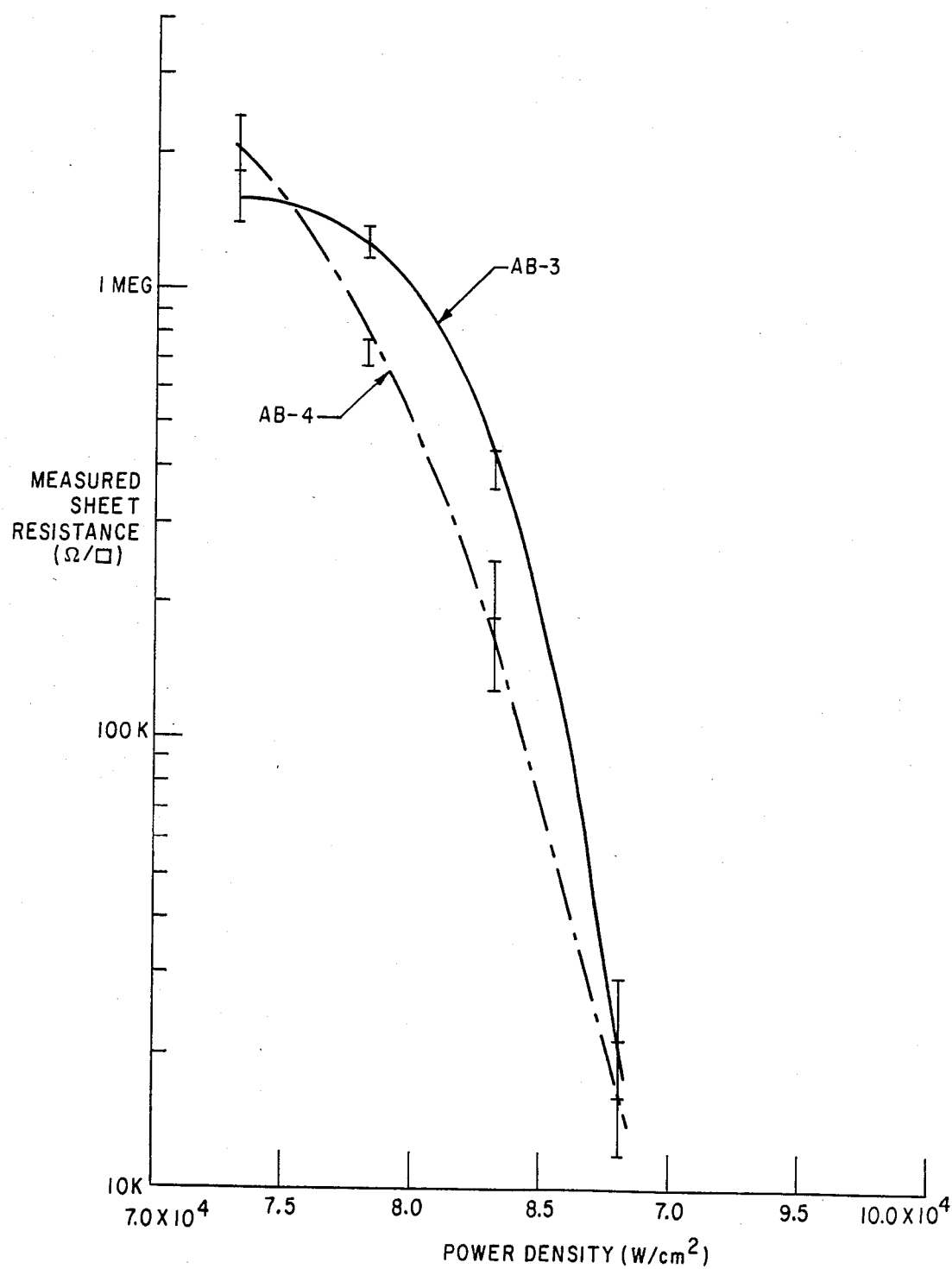
FIG. 8 shows the dependence of resistance on laser annealing conditions.

It should be noted that the processing steps used in practicing the present invention produce resistors having a lower bulk resistivity, and therefore a lower resistance for the same geometry and processing conditions, than the prior art methods. FIG. 8 shows the dependence of resistance on laser annealing conditions for a sample device.

It is also desirable to avoid high temperature steps in processing after the hydrogen passivation anneal since high temperature processing steps may permit some of the hydrogen to escape as molecular hydrogen.

That is, it is not necessary to avoid subsequent high temperature steps entirely, but the time spent at high temperatures is preferably minimized. Thus, for example, where a polysilicon resistor is covered by a multilevel oxide which must be reflowed, it is preferable to use a low temperature material for the multilevel oxide, such as the spin-on glass OCD or organic materials such as the dielectric polymer. Alternatively, transient annealing can be used for reflow of the multilevel oxide. Similarly, it is desirable to minimize the total time spent in such steps as contact sintering. However, the difficulty with high-temperature process steps is merely a very gradual escape of hydrogen from the passivated polysilicon. Since this is a gradual and not a catastrophic degradation, the sensitivity to high-temperature steps is not extreme, and it is certainly not necessary to avoid high-temperatures altogether.

It should be noted that hydrogen is not the only passivating species which can be used. However, any passivating species which is used should preferably exhibit electrical inactivity in silicon and good affinity for dangling bonds at grain boundaries.

It is also not necessary to use a plasma reactor for the hydrogen passivation, but a custom apparatus could be used instead. Uniformity of the plasma discharge is relatively unimportant, so that a configuration which included, e.g., an arc across an input gas stream of hydrogen, with all slices positioned downstream at a distance less than the recombination distance for the atomic and ionic hydrogen that is generated, would suffice.

Figure 3B:
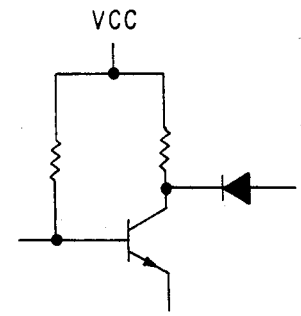
Figure 3A:
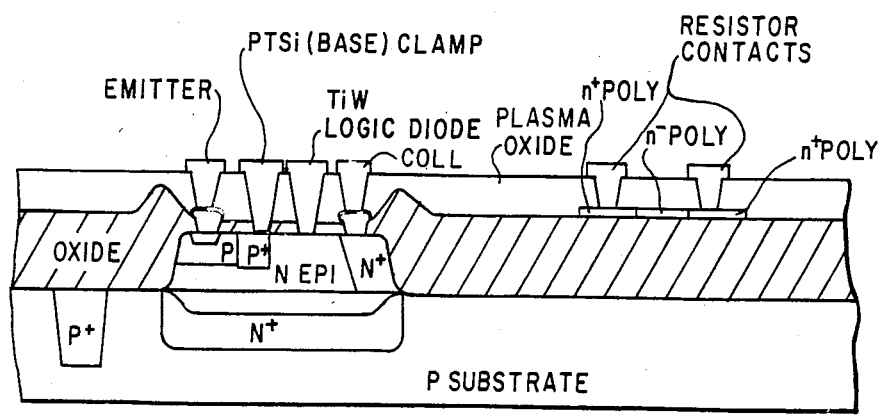
FIG. 3a shows a sample bipolar device of the present invention incorporating a polysilicon resistor having a positive TCR.

FIG. 3 shows a sample embodiment of the present invention in a polysilicon resistor in a bipolar integrated circuit. As will be appreciated by those skilled in the art, the present invention can be embodied in a tremendous variety of bipolar circuits, and is also useful in SRAMs and in MOS circuits generally. In particular, as current densities used in MOS circuits increase, problems of thermal stability become more important.

It should also be noted that laser annealing is not by any means necessary. The primary function of the laser annealing steps referred to above is merely to increase the grain size of the polysilicon, and this can be accomplished by other means. That is, any other transient annealing method, such as flash lamp or flip oven heating or electron beam annealing, can be used instead.

It should be noted that the hydrogen passivation can also alternatively be accomplished by ion implantation of protons.

Optionally, the laser annealing step may be performed with a double-wave length illumination source. In this case, a short wavelength which is strongly absorbed by polysilicon (e.g., 1.06 microns) is combined with a longer wavelength, such as 9.25 or 10.6 microns, which is unattenuated by the polysilicon but which is strongly absorbed by the underlying oxide. Both of these longer lines are conveniently available from a $CO_2$ laser.

This double wavelength annealing provides a larger grain size in the annealed material. The power ratio of the two wavelengths is approximately 1—1, and should in any case be within an order of magnitude of 1—1. In this embodiment, the total energy density is preferably about 3 joules per square centimeter, and in the range between 0.1 to 6 Joules per square centimeter.

In a further aspect of the present invention, the dependence of resistance on temperature for resistors formed in monocrystalline silicon (or other monocrystalline semiconductors) can also be modified.

To provide a zero-TCR resistor in semiconductor substrates, the resistor is preferably implanted rather than diffused. The implantation process itself will induce a significant amount of amorphization. Before this amorphization is annealed out, a reactive gas such as fluorine, chlorine or oxygen is introduced to pin various defects and subgrain boundaries in the silicon. In this case, even after the resistor is annealed, the $dR_p/dt$ dependence will still contain a substantial contribution from $\phi_B$ and therefore the positive TCR will be lowered.

As will be apparent to those skilled in the art, the present invention is not limited to the specific embodiments described above, and can be practiced in a wide range of modifications and variations.

What is claimed is:

1. A method for fabricating polysilicon resistors in integrated circuits, comprising the steps of:
   (a) providing a semiconductor substrate;
   (b) forming a doped polysilicon layer on said substrate;
   (c) annealing said polysilicon layer to increase the grain size thereof;
   (d) passivating said annealed polysilicon layer with a passivating species, to reduce the trap density at the grain boundaries of said polysilicon; and
   (e) forming spaced connections to said polysilicon to form a resistor.

2. The method of claim 1, wherein said transient annealing step comprises laser annealing.

3. The method of claim 2, wherein said transient annealing step applies an energy density of approximately 0.6 Joule per square centimeter.

4. The method of claim 1, further including forming an insulating layer on said substrate wherein said polysilicon is deposited over said insulating layer, and wherein said annealing step includes application of two wave lengths of light, comprising a first wavelength which is strongly absorbed by polysilicon and a second wavelength to which polysilicon is substantially transparent but which is strongly absorbed by said insulating layer.

5. The method of claim 1, wherein said passivating species comprises hydrogen ions.

6. The method of claim 5, wherein said passivating step comprises exposing said transiently annealed polysilicon to a hydrogen plasma.

7. The method of claim 5, wherein said passivating step comprises ion implanting said transiently annealed polysilicon with hydrogen ions.

8. The method of claim 1
   wherein said doped polysilicon is doped to a dopant concentration in the range of $10^{17}$ to $10^{18}$ atoms per cubic centimeter.

9. The method of claim 8, wherein said polysilicon comprises a thickness in the range of 500 to 6000 Angstroms.

10. The method of claim 1, wherein said annealing step comprises applying to said polysilicon layer an energy density sufficient to increase the grain size of said polysilicon to at least 3 microns.

11. A method of fabricating a resistor having a low temperature coefficient of resistance in a semiconductor substrate, comprising the steps of:
    (a) providing a semiconductor substrate;
    (b) implanting a dopant into said substrate in a desired location of said resistor;
    (c) pinning defects and subgrain boundaries in said implanted substrate in a gas selected from the class consisting of fluorine and chlorine; and
    (d) annealing said implant to form said resistor.

12. A method of forming polysilicon resistors in integrated circuits having substantially zero temperature coefficient of resistance, comprising the steps of:
    (a) providing a semiconductor substrate;
    (b) forming a doped polysilicon layer on said substrate;
    (c) increasing the grain size of the grains forming said polysilicon layer;
    (d) passivating the grain boundaries of said polysilicon layer; and
    (e) forming spaced connections to said polysilicon layer to form a resistor.

13. A method as set forth in claim 12 wherein step (c) comprises laser annealing of said polysilicon layer.

14. A method as set forth in claim 13 wherein step (d) comprises passivation using a hydrogen-containing species.

15. A method as set forth in claim 12 wherein step (d) comprises passivation using a hydrogen-containing species.

* * * * *